(12) United States Patent
Apard et al.

(10) Patent No.: US 7,728,889 B2
(45) Date of Patent: Jun. 1, 2010

(54) METHOD OF DRIVING A PHOTOSENSITIVE DEVICE

(75) Inventors: Paul Apard, Renage (FR); David Couder, Grenoble (FR)

(73) Assignee: Trixell S.A.S. (FR)

( * ) Notice: Subject to any disclaimer, the term of this patent is extended or adjusted under 35 U.S.C. 154(b) by 650 days.

(21) Appl. No.: 10/575,985

(22) PCT Filed: Oct. 13, 2004

(86) PCT No.: PCT/EP2004/052526

§ 371 (c)(1),
(2), (4) Date: Feb. 28, 2007

(87) PCT Pub. No.: WO2005/036871

PCT Pub. Date: Apr. 21, 2005

(65) Prior Publication Data

US 2007/0229688 A1    Oct. 4, 2007

(30) Foreign Application Priority Data

Oct. 17, 2003    (FR)    ................................... 03 12183

(51) Int. Cl.
*H04N 3/14* (2006.01)
*H04N 5/335* (2006.01)

(52) U.S. Cl. ...................... 348/294; 348/302; 348/308

(58) Field of Classification Search ......... 348/294–324; 250/208.1

See application file for complete search history.

(56) References Cited

U.S. PATENT DOCUMENTS

| | | | | |
|---|---|---|---|---|
| 4,957,659 A | * | 9/1990 | Arques et al. | ............. 250/208.1 |
| 5,668,375 A | | 9/1997 | Petrick et al. | |
| 7,142,240 B1 | * | 11/2006 | Hua et al. | ................... 348/302 |
| 2002/0114025 A1 | * | 8/2002 | Raynor et al. | ................ 358/513 |
| 2005/0045980 A1 | * | 3/2005 | Guidash | ...................... 257/432 |

FOREIGN PATENT DOCUMENTS

| | | |
|---|---|---|
| EP | 0517303 A1 | 12/1992 |
| FR | 2605166 A1 | 4/1988 |
| FR | 2760585 A1 | 9/1998 |
| FR | 2770954 A1 | 5/1999 |

* cited by examiner

*Primary Examiner*—Yogesh K Aggarwal
(74) *Attorney, Agent, or Firm*—Lowe Hauptman Ham & Berner, LLP

(57) ABSTRACT

The present invention relates to a method of driving a photosensitive device comprising a matrix of photosensitive pixels distributed at the intersections of rows and columns of the matrix. The invention relates more particularly to the control of such devices used for the detection of radiological images. The method consists in subjecting the matrix to an image cycle that includes a reset phase prior to an image acquisition phase. The rows of the matrix are distributed in several groups, and during the reset phase, the method consists in resetting all the rows in any one group simultaneously and in resetting each group of rows in succession.

5 Claims, 3 Drawing Sheets

METHOD OF DRIVING A PHOTOSENSITIVE DEVICE

BACKGROUND OF THE INVENTION

The present invention relates to a method of driving a photosensitive device comprising a matrix of photosensitive pixels of the type produced in particular by techniques for depositing semiconductor materials. The invention relates more particularly (but not exclusively) to the driving of such devices used for radiological image detection.

Techniques for the thin-film deposition of semiconductor materials, such as hydrogenated amorphous silicon (a-SiH), on insulating, for example glass, supports that are used to produce matrices of photosensitive pixels that can produce an image from visible or near-visible radiation. To use these matrices for the detection of radiological images, all that is required is to interpose, between the X-radiation and the matrix, a scintillator screen that converts the X-radiation into light radiation within the band of wavelength at which the photosensitive pixels are sensitive.

The photosensitive pixels that form such a matrix generally comprise a photosensitive element associated with an element providing a switch function. The photosensitive pixel is mounted between a row conductor and a column conductor of the matrix. Depending on the requirements, the photosensitive device then comprises a plurality of photosensitive pixels arranged as a matrix or as a linear array.

The photosensitive element usually consists of a diode connected in series with the switch element. The switch element may, for example, be a transistor produced by thin film deposition techniques. These techniques are known as TFT (thin film transistor) techniques. The switch element may also be a switching diode whose "closed" or "on" state corresponds to the bias that drives it into forward conduction and whose "open" or "off" state corresponds to its reverse bias. The two diodes are connected with opposed conduction directions in a configuration called "back-to-back". Such an arrangement is well known, for example from French patent application 86/14058 (publication No. 2 605 166) which describes a matrix of photosensitive pixels of the type with two diodes in a "back-to-back" configuration, a method of reading the photosensitive pixels and a way of producing such a photosensitive device. The components forming the matrix are produced from an amorphous semiconductor material that produces persistence. This is due to its amorphous structure, which includes a large number of traps, much more than in crystalline materials. These traps are structure defects which extend over the entire band gap. They retain charges generated during image acquisition. The material stores an image corresponding to a given irradiation and restores the charges relating to this image while the following image is being read, or even while several following images are being read. The quality of the images is thereby degraded.

To attempt to obtain a useful image of optimum quality, a correction is applied to the useful image on the basis of what is called an "offset image", also known as "dark image" that is generally acquired and stored at the start of an operating cycle. This offset image is the image obtained when the photosensitive device is exposed to a signal of zero intensity and corresponds to a kind of background image. The offset image varies according to the electrical state of the components of the photosensitive pixels and to the dispersion in their electrical characteristics. The useful image is that read whenever the photosensitive device has been exposed to a useful signal that corresponds to exposure to X-radiation. It includes the offset image. The correction consists in subtracting the offset image from the useful image.

To produce a useful image or an offset image, an image cycle is performed, that is to say a sequence formed by an image acquisition phase followed by a read phase and then by an erase and reset phase, as explained in patent application FR-A-2 760 585. During the image acquisition phase, the photosensitive pixels are exposed to a signal to be picked up, whether this signal is a maximum illumination signal or the dark signal. During the read phase, a read pulse is applied to the row conductors addressed for reading the amount of charge stored during the image acquisition. During the erase phase, the photosensitive pixels are erased, generally optically by means of a light flash uniformly distributed over all the photosensitive pixels. During the reset phase, the photosensitive pixels are reset to a state in which they are receptive to a new image acquisition. This resetting is performed by temporarily making the switching element, switching diode or transistor, conducting by means of an electrical pulse sent to the row conductors for addressing the matrix.

Hitherto, the photosensitive pixels of a matrix have been reset by generating a single electrical pulse simultaneously for all the photosensitive pixels of the matrix via the row conductors of the matrix. Unfortunately, the photosensitive pixels are not perfect. They are subject to parasitic elements, the modeling of which will be presented later with the aid of FIG. 3. These parasitic elements are essentially capacitive couplings. The rising edge of the electrical pulse sent to the row conductors of the matrix in order to turn on the switching elements injects charges onto column conductors of the matrix. The rising edge that opens the switching element is critical. The charges created on the column conductors by this rising edge can be discharged only via read circuits connected to the column conductors. These charges take a certain amount of time to be discharged and therefore temporarily cause a variation in the voltage on each column conductor. This voltage variation occurs at the moment when the photosensitive pixel is isolated. More precisely, it is the moment when the potential of the common point A between the photodiode and the switching element is fixed. This potential is essential as it is this which changes during the image acquisition phase owing to the effect of the light radiation received by the photodiode. This potential therefore depends on the voltage of the corresponding column conductor at the precise moment when the switching element opens. The presence of this voltage on the column conductor causes an average offset shift and therefore a loss of dynamic range in the useful image.

In addition, the moment when the switching element opens is not strictly identical for all the photo-sensitive pixels. This moment depends on the dispersion in the threshold voltages for each switching element and on the dispersion of the parasitic elements. This results in a dispersion in the offset for each photo-sensitive pixel.

It has been attempted to reduce the voltage on the column conductor, on the one hand by reducing the amplitude of the electrical pulse sent to the row conductors during the reset phase relative to the amplitude of the electrical pulse sent to the row conductors during the read phase and, on the other hand, by extending the rising edge that opens the switching element so that the switching time of the switching element is longer than the time needed to drain away the charges in the column conductors. This palliative remains somewhat unsatisfactory as it improves only few of the problems encountered. In addition, owing to the dissymmetry of the pulses between the reset phase and the read phase, this palliative results in a few offset stability defects.

SUMMARY OF THE INVENTION

The object of the invention is to appreciably alleviate the problems encountered and, for this purpose, the subject of the invention is a method of driving a photosensitive device, comprising a matrix of photo-sensitive pixels distributed at the intersections of rows and columns of the matrix, which consists in subjecting the matrix to an image cycle that includes a resetting phase prior to an image acquisition phase, characterized in that rows of the matrix are distributed in several groups, in that it consists, during the resetting phase, in resetting all the rows of any one group simultaneously and in that it consists in resetting each group of rows in succession.

BRIEF DESCRIPTION OF THE DRAWING

The invention will be more clearly understood and other advantages will appear on reading the detailed description of several ways of implementing the invention, given as examples, and embodiments illustrated by the appended drawing in which.

DETAILED DESCRIPTION OF THE PREFERRED EMBODIMENT

Figure 1:
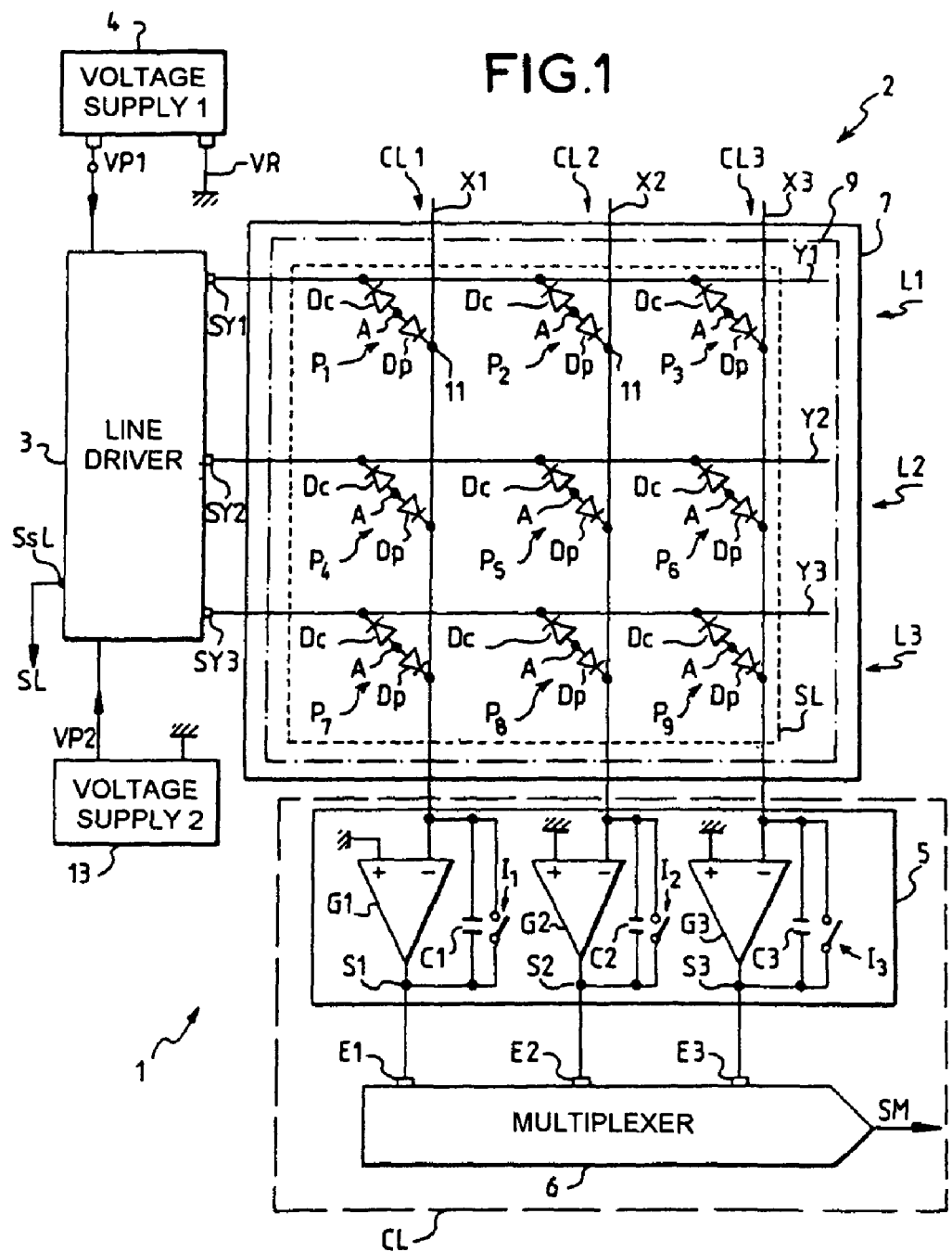
FIGS. 1 and 2 show photosensitive devices to which the invention is applicable.

FIG. 1 shows a simplified diagram of a photosensitive device 1, comprising a matrix 2 organized in a conventional manner. The matrix 2 comprises photosensitive pixels P1 to P9, each formed by a photosensitive diode Dp and a switching diode Dc connected in series in a back-to-back configuration. The matrix includes row conductors Y1 to Y3 intersecting with column conductors X1 to X3, with, at each intersection, a photosensitive pixel connected between a row conductor and a column conductor. The photosensitive pixels P1 to P9 are thus arranged along rows R1 to R3 and columns CL1 to CL3.

In the example of FIG. 1, only three rows and three columns are shown, these defining nine photosensitive pixels, but such a matrix may have a much greater capacity, with possibly up to several million pixels. For example, it is common practice to produce such matrices having photosensitive pixels arranged in 3 000 rows and 3 000 columns (over an area of around 40 cm×40 cm) or else arranged along a single column and several rows, in order to constitute a linear detection array.

The photosensitive device includes a line driver 3, the outputs SY1, SY2, SY3 are connected to the row conductors Y1, Y2, Y3, respectively. The line driver 3 is made up of various elements (not shown) such as, for example, a clock circuit, switching circuits and a shift register, which allow it to address the row conductors Y1 to Y3 sequentially. The photosensitive device furthermore includes a voltage supply 4 that delivers a voltage VP1 to the line driver 3 for defining the amplitude of the bias pulses applied to the row conductors and a voltage supply 13 that delivers a voltage VP2 to the line driver 3 for defining the amplitude of read pulses applied to the row conductors. These two voltage supplies may optionally be one and the same.

In each photosensitive pixel P1 to P9, the two diodes Dp, Dc are connected together either by their cathodes or, as in the example shown, by their anodes. The cathode of the photodiode Dp is connected to a column conductor X1 to X3 and the cathode of the switching diode Dc is connected to a row conductor Y1 to Y3.

In the image acquisition or image-taking phase, that is to say the phase in which the matrix 2 is illuminated by a "useful" light signal, the two diodes Dp, Dc of each photosensitive pixel P1 to P9 are reverse-biased, and in this state they each constitute a capacitor. It should be noted that in general the two diodes Dp, Dc are designed so that the capacitance presented by the photodiode Dp is the higher one (for example around 50 times higher).

When exposed to a useful light signal, charges are generated in the photodiode Dp by the illumination of the photosensitive pixel P1 to P9 to which it belongs. These charges, the number of which depends on the intensity of illumination, build up at a point "A" on the (floating) node formed at the junction between the two diodes Dp, Dc. The photosensitive pixels P1 to P9 are read row by row, simultaneously for all the photosensitive pixels connected to the same row conductor Y1 to Y3. For this purpose, the line driver 3 applies a read pulse of given amplitude to each row conductor Y1 to Y3 addressed; the row conductors that are not addressed are kept at a reference or rest potential Vr, which is ground potential for example, and may be the same potential as that applied to the column conductors X1 to X3.

Any accumulation of charges at the point "A" of a photosensitive pixel P1 to P9 causes a reduction in the voltage at this point, that is to say a reduction in the reverse bias voltage for the photodiode Dp. In certain operating modes, the application of the read pulse to a row conductor Y1 to Y3 has the effect of restoring, to the potential of the point "A" of all the photosensitive pixels connected to this row conductor, the bias level that it had before exposure to the useful light signal: this results in a flow in each of the column conductors X1 to X3 of a current proportional to the charges accumulated at the corresponding point "A".

The column conductors X1 to X3 are connected to a read circuit RC comprising, in the example, an integrator circuit 5 and a multiplexer circuit 6 which is formed, for example, by a shift register with parallel inputs and serial output. Each column conductor is connected to a negative input "−" of an amplifier G1 to G3 connected as an integrator. An integration capacitor C1 to C3 is connected between the negative input "−" and an output S1 to S3 of each amplifier. The second input "+" of each amplifier G1 to G3 is connected to a potential which, in the example, is the reference potential Vr, which potential is consequently imposed on all the column conductors X1 to X3. Each amplifier includes a reset switch element I1 to I3 (formed, for example, by an MOS-type transistor) connected in parallel to each integration capacitor C1 to C3.

The outputs S1 to S3 of the amplifiers are connected to the inputs E1 to E3 of the multiplexer 6. This conventional arrangement makes it possible to deliver, "serially" and row by row (R1 to R3), as output SM from the multiplexer 6, signals corresponding to the charges accumulated at the points "A" of all the photosensitive pixels P1 to P9.

It should be noted that it is also known, in order to fulfill the switch function which, in the example of FIG. 1, is provided by the switching diode Dc, to use a transistor; the latter has, compared with the diode, a greater connection complexity, but it does have advantages in the quality of its "on" state, which advantages will be explained in the rest of the description.

Figure 2:
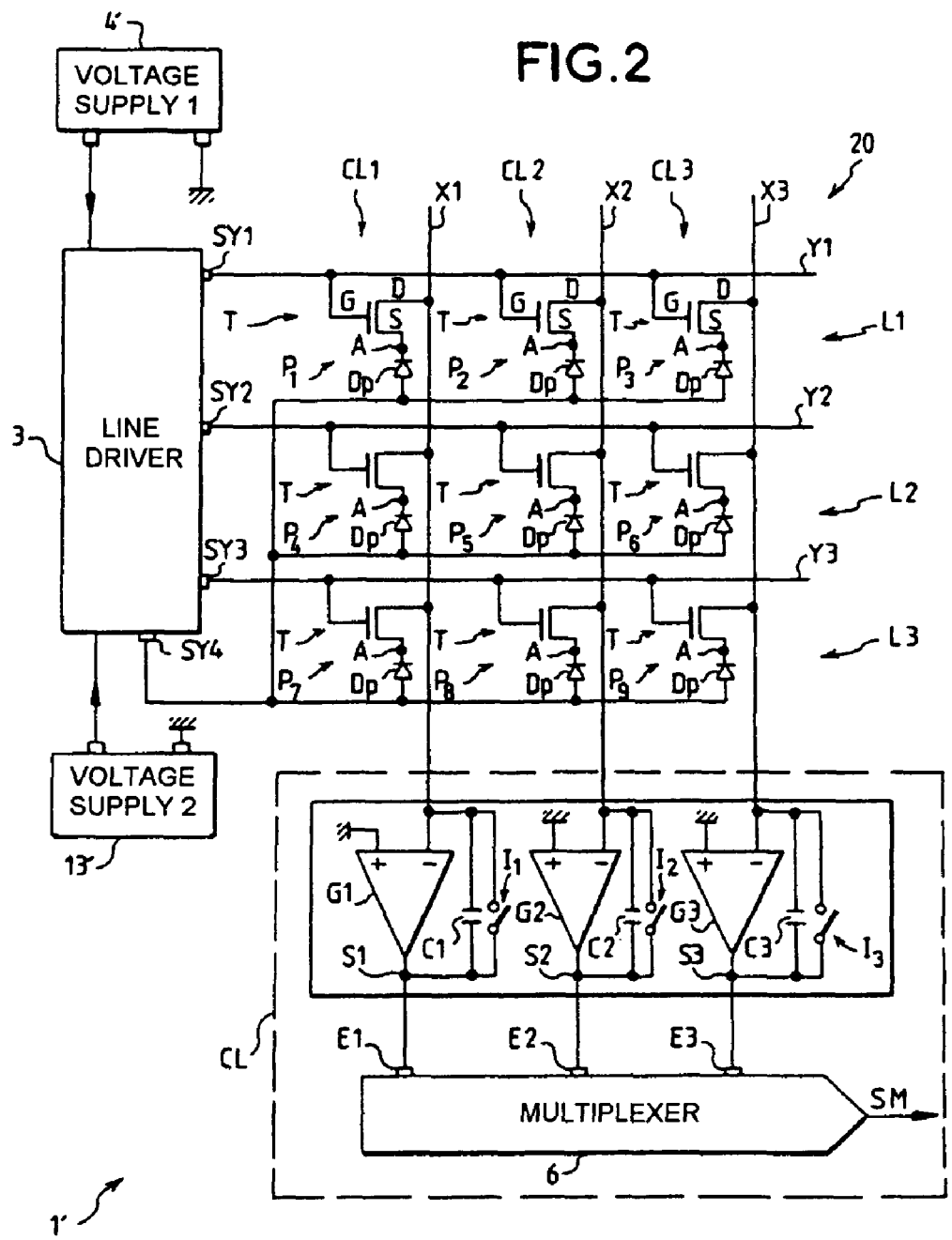

FIG. 2 illustrates schematically a photosensitive device 1' that differs from that of FIG. 1 mainly in that it comprises a matrix 20 in which the switching diodes Dc are replaced with transistors T, for example produced by thin-film deposition techniques. These are known as TFT (Thin Film Transistor) techniques. These techniques may also be used to produce the matrix 2 shown in FIG. 1.

In the diagram shown in FIG. 2 as an example, the transistor T in each photosensitive pixel P1 to P9 is connected by its source S to the cathode of the photodiode Dp, that is to say at the point "A", its gate G is connected to the row conductor Y1 to Y3 to which the photosensitive pixel belongs and its drain D is connected to the column conductor X1 to X3 to which the photosensitive pixel belongs. The anodes of all the photodiodes Dp are joined together and connected to an output SY4 of the line driver 3. The output SY4 delivers a bias voltage $V_{bias}$, negative relative to the reference potential Vr or ground potential, around −5 volts for example, which serves to reverse-bias the photodiodes Dp; the line driver 3 receives, for example, this bias voltage from a supply 4'.

For a greater understanding of the operation of the devices shown in FIGS. 1 and 2, reference may be made to the French patent application published under No. FR 2 760 585.

Figure 3:
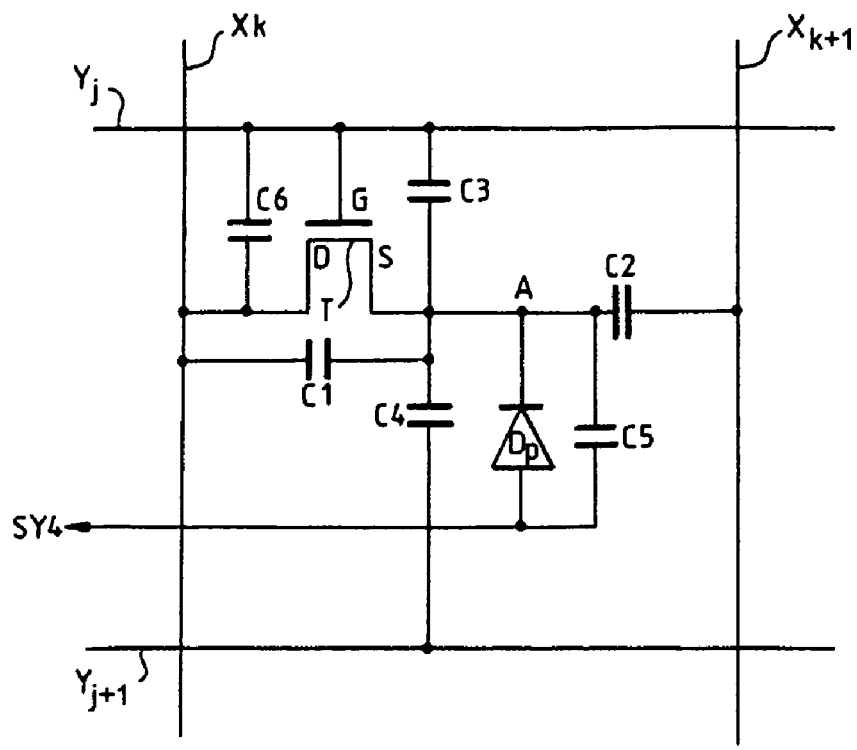
FIG. 3 shows a model of parasitic elements present for contiguous photosensitive pixels of a device according to FIG. 2.

FIG. 3 shows a model of the parasitic elements, essentially capacitors, present around a photosensitive pixel as described in FIG. 2. Of course, parasitic elements of the same kind also exist for a matrix as shown in FIG. 1. The photosensitive pixel shown in FIG. 3 is located between the row conductors $Y_j$ and $Y_{j+1}$ and between the column conductors $X_k$ and $X_{k+1}$. Six capacitors C1 to C6 model the parasitic elements associated with the photosensitive pixel. The capacitor C1 connects the source S of the transistor T and the column conductor $X_k$. The capacitor C2 connects the source S of the transistor T and the column conductor $X_{k+1}$. The capacitor C3 connects the source S of the transistor T and the row conductor $Y_j$. The capacitor C4 connects the source S of the transistor T and the row conductor $Y_{j+1}$. The capacitor C5 connects the source S of the transistor T and the anode of the photodiode Dp. The capacitor C6 connects the drain D of the transistor T and the row conductor $Y_j$.

These parasitic elements disturb the operation of an image cycle. In addition, the value of the parasitic elements varies from one photosensitive pixel to another.

In the method of the invention, the rows of the matrix are distributed in several groups, and during the resetting phase, all the rows of any one group are reset simultaneously. The various groups of rows are reset in succession and not simultaneously. More precisely, the method consists in waiting until resetting of a group has been completed before starting to reset another group. The resetting of the entire matrix takes place sequentially. Thus, the number of charges induced on the column conductors is reduced. These charges are therefore removed more easily into the column conductors via the read circuit RC. Thus, the potential of the common point A between the transistor T or the photosensitive diode Dp and the switching diode Dc is less disturbed by the potential of the column conductors. Advantageously, the groups of rows have approximately the same number of rows. Thus, the number of charges induced on the column conductors is approximately the same during all the individual resetting operations carried out for each of the groups of rows. For example, if the total number of rows in the matrix is N and the number of rows per group is n, the number of charges induced by the column conductors is reduced by a factor $\alpha = N/n$. The factor $\alpha$ defines the number of groups. The number n of rows per group must be small enough that a sufficient amplitude for the electrical pulse sent to the row conductors of the group during the resetting phase can be maintained and, if possible, this amplitude is identical to that sent to the row conductors during the read phase. The number n of rows per group must be large enough for the time devoted to all of the individual resetting operations to remain short. In other words, $\alpha$ is chosen so as to optimize precision and speed.

Advantageously, the n rows of any one group are disjoint so as to avoid coupling dissymmetries. This is because if the rows of any one group were to be contiguous, the coupling due to the parasitic elements shown in FIG. 3 would be different between two adjacent rows of any one group and two adjacent rows of two different groups. Advantageously, the rows of any one group are separated by at least two rows that do not belong to the group in question.

Figure 4:
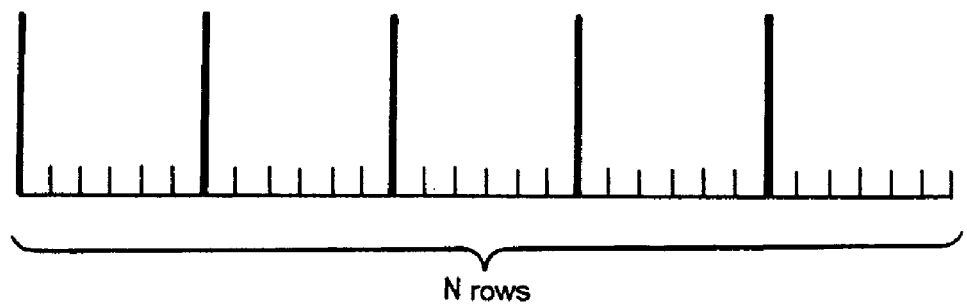
FIG. 4 shows the distribution of the rows in a group of rows for which the resetting of the photo-sensitive pixels is carried out simultaneously.

Advantageously, the method consists in linking up the individual resetting operations combwise. More precisely, the n rows forming a group are uniformly spaced apart with a pitch equal to $\alpha = N/n$. The distribution of the rows in a group is shown in FIG. 4 and these rows form a comb. The N rows of the matrix are shown as short lines. The rows of the first group are shown as taller lines and these form teeth of the comb. Each tooth of the comb is reset at a given instant. For complete resetting of the matrix, the comb is moved at least $\alpha - 1$ times so as to scan all of the N rows of the matrix and, for each movement of the comb, a new individual resetting operation is performed. The rows in a group of the matrix may be addressed by means of a shift register, which positions an address voltage pointer on a row chosen to be the first row in the group. The n row pointers of the group are positioned by inputting a charging pulse into the shift register every $\alpha$ clock pulses. While the rows of the group are being addressed, no pulse is sent to the rows.

Advantageously, the read pulse sent in succession to each row of the matrix during the read phase, in order to read the amount of charge stored at the photosensitive pixels during the image acquisition phase, is substantially identical to the reset pulse sent to all the rows of any one group. This identity of the electrical read pulse and the associated reset pulse, owing to the fact that the rows in any one group are disjoint, makes it possible to obtain good symmetry between the residual perturbations undergone by each photosensitive pixel during the two phases, namely the read phase and the reset phase. Thus, the perturbations of the two phases are subtracted and their influence on the image tends to disappear.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A method of driving a photosensitive device having a matrix of photosensitive pixels distributed at the intersections of rows and columns of the matrix, the method comprising:
    subjecting the matrix to an image cycle that includes a resetting phase prior to an image acquisition phase, wherein rows of the matrix are distributed in several groups;
    during the resetting phase, resetting all the rows of any one group simultaneously; and resetting each group of rows in succession, wherein all the rows in any one group are disjoint and the distribution of the rows in a group form a comb;

wherein rows forming a group are uniformly spaced apart with a pitch equal to $\alpha=N/n$, where N is the total number of rows of the matrix, n is the number of rows per group, $\alpha>1$, and wherein the comb is moved at least $\alpha-1$ times so as to scan all of the rows of the matrix.

2. The method as claimed in claim 1, wherein the rows in any one group are separated by at least two rows that do not belong to the group in question.

3. The method as claimed in claim 1, wherein the groups of rows have approximately the same number of rows.

4. The method as claimed in claim 1, further comprising waiting until the resetting of a group has been completed before starting to reset another group.

5. The method as claimed in claim 1, wherein the image acquisition phase is followed by a read phase during which a first electrical pulse is sent in succession to each row of the matrix, the first pulse making it possible to read the quantity of charge stored in the photosensitive pixels during the image acquisition phase, in that, during the reset phase, a second electrical pulse is sent to all the rows in any one group, in order to reset the rows in the group, and wherein the first and second pulses are substantially identical.

* * * * *